United States Patent [19]

Hernandez

[11] Patent Number: 4,853,827
[45] Date of Patent: Aug. 1, 1989

[54] HIGH DIELECTRIC MULTILAYER CAPACITOR

[75] Inventor: Jorge M. Hernandez, Mesa, Ariz.
[73] Assignee: Rogers Corporation, Rogers, Conn.
[21] Appl. No.: 291,520
[22] Filed: Dec. 29, 1988

Related U.S. Application Data

[63] Continuation-in-part of Ser. No. 226,619, Aug. 1, 1988.
[51] Int. Cl.⁴ .......................... H01G 4/10; H01G 4/38
[52] U.S. Cl. ...................................... 361/321; 361/330
[58] Field of Search ................. 428/44; 252/62.3 BT; 361/401, 403, 323, 328, 330, 320, 321

[56] References Cited

U.S. PATENT DOCUMENTS

| | | | |
|---|---|---|---|
| 3,582,729 | 6/1971 | Girard et al. | 361/320 |
| 3,673,092 | 6/1972 | Dietz | 361/320 X |
| 3,720,862 | 3/1973 | Mason | 361/320 |
| 3,988,405 | 10/1976 | Smith et al. | 361/320 X |
| 4,071,881 | 1/1978 | Bacher | 361/320 |
| 4,752,857 | 6/1988 | Khoury et al. | 252/62.3 BT X |

Primary Examiner—Donald A. Griffin
Attorney, Agent, or Firm—Fishman, Dionne & Cantor

[57] ABSTRACT

A multilayer capacitor is presented which provides high capacitance and low inductance. The capacitor comprises a plurality of conductive layers, each separated from the other and sandwiching therebetween a high capacitance flexible dielectric sheet material. The dielectric sheet material is comprised of a monolayer of multilayer or single layer high dielectric (e.g. ceramic) chips or pellets of relatively small area and thickness which are arranged in a planar array. These high dielectric constant chips are spaced apart by a small distance. The spaces between the chips are then filled with a flexible polymer/adhesive to define a cohesive sheet with the polymer binding the array of high dielectric (e.g. ceramic) chips together. Next, the opposite planar surfaces of the array (including the polymer) are electroless plated or electroded by vacuum metal deposition, or sputtering, to define opposed metallized surfaces.

16 Claims, 7 Drawing Sheets

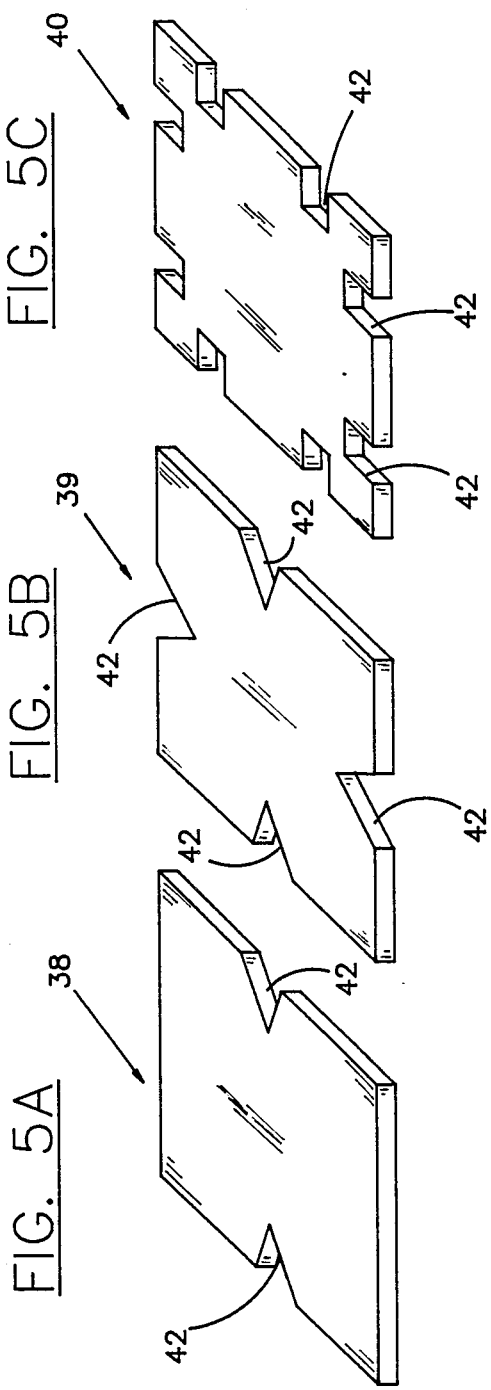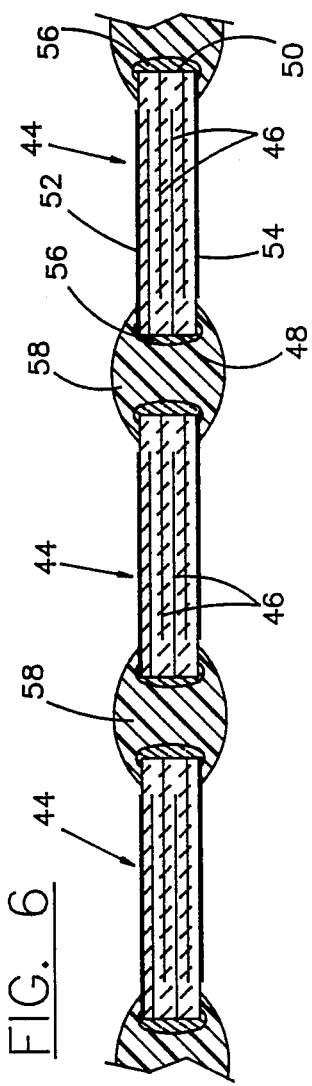

HIGH DIELECTRIC MULTILAYER CAPACITOR

BACKGROUND OF THE INVENTION

This invention relates to the field of multi layer capacitors. More particularly, this invention relates to a multi layer capacitor which incorporates a flexible high dielectric constant sheet material as its insulator which results in a high capacitance, low inductance capacitor.

It will be appreciated that there is an ever increasing need for a reliable, flexible high dielectric material which may be used for a variety of applications in electronic circuitry design and manufacture. Presently, flexible high dielectric materials of this type are manufactured by mixing small particles (e.g. 1-3 microns) of a high dielectric constant material into a flexible polymeric matrix. Surprisingly, the resultant effective dielectric constant of the dielectric impregnated polymer is relatively low. For example, the dielectric constant of a Z5U BaTiO$_3$ is in the range of 10,000 to 12,000. However, when such Barium Titanate is mixed with a flexible polymer such as polyimide, polyester, polyetherimide and like materials, the effective dielectric constant realizable is only on the order of 20 to 40 (depending on the loading ratio of the dielectric in the polymer).

It will be further appreciated that a need exists for a very high capacitance capacitor that has low inductance and low equivalent series resistance (ESR). This need is especially perceived in applications such as noise suppression in high current power distribution systems for digital computers, telecommunications modules, AC ripple filtering in DC power supplies, etc.

It will be appreciated that prior art capacitive devices all suffer from high ESR and high expense. An example of a prior art device is an aluminium electrolytic capacitor which has a high ESR (Equivalent Series Resistance), is bulky and is awkward to install. Another example of a prior art device is a large monolithic ceramic capacitor which is very expensive. Yet another example of a prior art device is a Tantalum capacitor which has a high ESR and is only suitable for very low voltages of three to six volts.

SUMMARY OF THE INVENTION

The above-discussed and other problems and deficiencies of the prior art are overcome or alleviated by the high capacitance multi layer capacitor of the present invention.

In accordance with the present invention, a plurality of conductive elements are separated by and sandwiched between a plurality of layers of a high capacitance flexible dielectric material. The dielectric material is comprised of a monolayer of multilayer or single layer high dielectric constant (e.g. ceramic) chips or pellets of relatively small area and thickness which are arranged in a planar array. These high dielectric constant chips are spaced apart by a small distance. The spaces between the chips are then filled with a flexible polymer/adhesive to define a cohesive sheet with the polymer binding the array of high dielectric constant (e.g. ceramic) chips together. Next, the opposite planar surfaces of the array (including the polymer) are metallized (e.g. electroless plated or metallized by vacuum deposition, sputtering, etc.) to define opposed metallized surfaces. The end result is a relatively flexible high capacitance dielectric film or sheet material which is drillable, platable, printable, etchable, laminable and reliable.

In a preferred embodiment, the small high dielectric constant chip are cylindrical in shape. However, the chips may be any other suitable shape including rectangular. Also, the high dielectric constant chips may include punches or cut-outs to improve mechanical adhesion between the chips and the polymeric binding material.

Also as mentioned above, rather than using high dielectric constant (ceramic) pellets, the discrete high dielectric constant monolayer may be comprised of an array of multilayer ceramic chips such as those disclosed at FIGS. 4 and 10 in U.S. Pat. No. 4,748,537 and at FIGS. 11–16 in U.S. Pat. No. 4,706,162, all of which are assigned to the assignee hereof and incorporated herein by reference.

The high capacitance multilayer capacitor provides a very high capacitance capacitor module, yet it has low inductance and low ESR. The capacitor is compact and easily installed. The capacitor of the present invention is highly reliable, by virtue of using relatively thick ceramic chip elements as parts of the individual high capacitance flexible layers. This is in contrast to prior art MLC capacitors which use very thin dielectric layers (less than or equal to 0.001") where small deviations in thickness, or holes in the layer may cause problems.

The above discussed and other features and advantages of the present invention will be appreciated and understood by those of ordinary skill in the art from the following detailed description and drawing.

BRIEF DESCRIPTION OF THE DRAWINGS

Referring now to the drawings, wherein like elements are numbered alike in the several FIGURES:

FIGS. 5A and 5B and 5C are perspective views of alternative high dielectric constant pellet configurations which may be used in accordance with the present invention;

FIG. 6 is a cross-sectional elevation view of still another embodiment of the present invention utilizing multilayer capacitive elements;

FIG. 14 is a cross-sectional view of the capacitor of FIG. 12.

DESCRIPTION OF THE PREFERRED EMBODIMENT

The present invention relates to a high capacitance multi-layer capacitive element comprised of a plurality of interleaved conductive electrodes separated by a plurality of sheets of a high dielectric constant flexible polymeric material.

Figure 1:
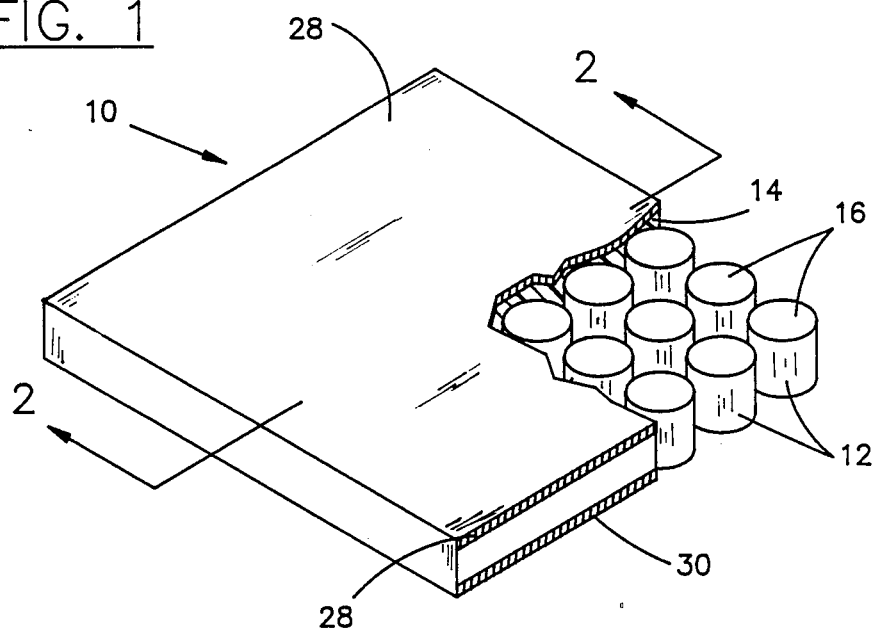
FIG. 1 is a perspective view of the high dielectric constant flexible sheet material of the present invention.
Figure 2:
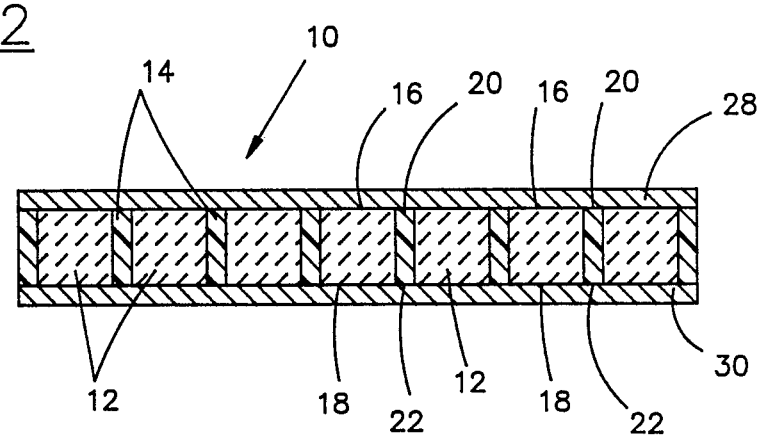
FIG. 2 is a cross-sectional elevation view along the line 2—2 of FIG. 1.

Referring first to FIGS. 1 and 2, the high dielectric constant flexible polymeric sheet material is shown generally at 10. Flexible sheet 10 is comprised of a monolayer of high dielectric constant pellets or chips 12 which are of relatively small area and thickness and are arranged in a planar array. The chips are separated from each other by a small distance to define spaces therebetween. The spaces between the chips 12 are filled with a suitable polymeric material 14. Polymeric material 14 will act as a binder to hold the array of high dielectric constant pellets 12 together. Significantly, polymeric material 14 will contact only the sides of pellets 12 and will be out of contact with the top and bottom surfaces 16 and 18 of each pellet 12. This will result in both end surfaces 16, 18 of high dielectric constant pellets 12 and end surfaces 20, 22 of polymeric binder 14 being exposed. Next, these opposed and exposed surfaces (comprised of surfaces 16 and 20 on the one hand and surfaces 18 and 22 on the other hand) of the pellet array and polymer are metallized to define a thin (e.g. about 10-50 micro inches) metallized layer 24 and 26. These thin metallized layers 24 and 26 may then be plated up to higher thicknesses (e.g. about 1-2 mils) by well known electroplating techniques to define layers 28 and 30. The thin metallized layers may be produced using any known method including electroless plating or by vapor deposition techniques including vacuum deposition, sputtering, etc.

The material used to produce high dielectric constant pellets 12 may be any suitable high dielectric constant material and is preferably a high dielectric constant ceramic material such as $BaTiO_3$. In addition, other known high dielectric ceramic materials may be utilized including lead magnesium niobate, iron tungsten niobate, etc. It will be appreciated that by "high" dielectric constant, it is meant dielectric constants of over about 10,000. As mentioned, the pellets are relatively small and are preferably cylindrical in shape having a height of 0.015" and a diameter of 0.020". If a ceramic is used, the pellets should be fully sintered prior to being bonded together by the polymer.

Of course, while cylindrical configurations for the array of pellets 12 are preferred, any other suitably shaped high dielectric constant pellet may be used. For example, in FIG. 3, a flexible high capacitance sheet is shown at 32 incorporating an array of rectangularly shaped pellets 34 in a polymer matrix 36. Also, in FIGS. 5A–5C, square shaped pellets are shown at 38, 39 and 40 respectively which are provided with from two through eight slots or grooves 42. It will be appreciated that these grooves or slots will provide a stronger mechanical bond between the polymeric binder and the pellet.

The pellet array is impregnated with a suitable polymer which may be a either a flexible thermoplastic or a flexibilized thermoset (epoxy, polyetherimide, polyester, etc.) to give the array mechanical strength and electrical insulating stability with temperature, moisture, solvents, etc. The polymeric material should be a high temperature (approximately 350° F.) polymer which is somewhat flexible and has a dielectric constant of between about 4–9. Preferred materials include polyetherimides, polyimides, polyesters and epoxies. It will be appreciated that the flexibility is necessary to preclude cracking of the sheet under stress.

Preferably, the dielectric sheet is electroless plated with copper or nickel.

The resultant sheet material will have an effective high dielectric constant of better than 1,000, a small thickness (approximately 0.005"–0.015"), will be flexible, will be metallized on both sides and will be drillable and platable.

EXAMPLES

A mathematical analysis can be made to determine the effective dielectric constant of the combined pellet array and polymeric matrix.

EXAMPLE 1

For example, using a dielectric sheet as depicted in FIGS. 1 and 2 which incorporates cylindrical pellets measuring 0.020" in diameter by 0.010" in length; and assuming a sheet of one square inch having a total of about 2,500 cylinders.

Capacitance of the dielectric sheet is determined using the following formula:

$$C = \epsilon \times (\epsilon_0) \times (a/D) \times (N) \tag{1}$$

where
C = total capacitance
$\epsilon$ = relative permitivity of the dielectric
$\epsilon_0$ = permitivity of free space
a = area of electroded part of dielectric
D = distance between two electrodes of dielectric
N = number of dielectric pellets Assuming that the pellets are made of a Z5U dielectric with a dielectric constant of 15,000, then the capacitance of such an array would be:
$\epsilon = 15,000$
$\epsilon_0 = 8.85 \times 10^{-12}$
$a = 2.827 \times 10^{-7} \, m^2$
$D = 3 \times 10^{-4} \, m$
$N = 2500$
Thus:

$$C = 15,000 \times 8.85 \times 10^{-12} \times \frac{2.827 \times 10^{-7}}{3 \times 10^{-4}} \times 2500$$

or C=312 nF/sq.-in. or 312,500 pF/sq.in.

If an X7R dielectric (with a dielectric constant of 4500) is utilized, then using the above equation (1), the capacitance per square inch would be about 93.6 nF/sq.in.

EXAMPLE 2

Figure 3:
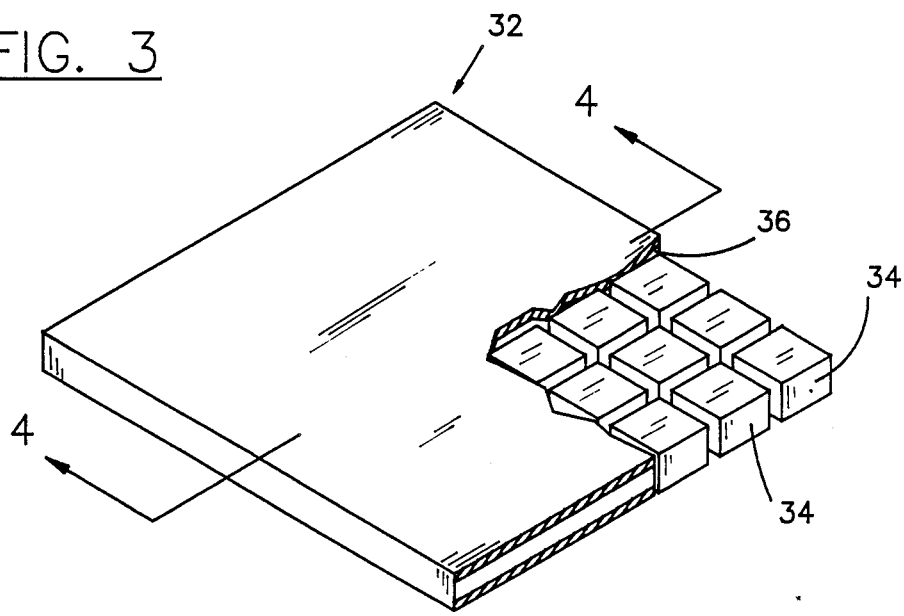
FIG. 3 is a perspective view, similar to FIG. 1, of a different embodiment of the present invention.
Figure 4:
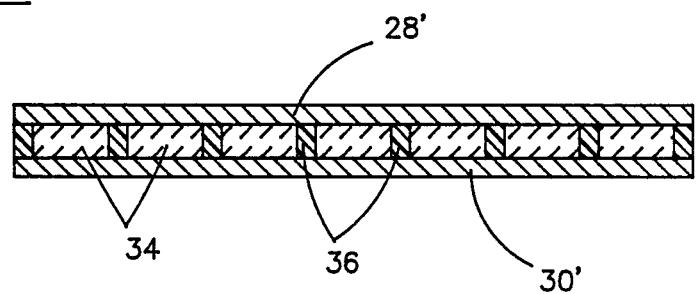
FIG. 4 is a cross-sectional elevation view along the line 4—4 of FIG. 3.

If a rectangular ceramic pellet (such as shown in FIG. 3) made from lead magnesium niobate (having a dielectric constant of 17,000) is selected with each pellet having surface area dimensions of 0.20"×0.30" and 0.015" in thickness; and with the array of pellets being spaced apart 0.020", then, using the same calculations as in Example 1, the capacitance will be 224 nF/sq.in. Alternately, if an internal boundary layer dielectric is selected with a dielectric constant of approximately 60,000 [such as $(Sr_{0.4}Ba_{0.6})TiO_3 + 1OH_2O$] then the effective capacitance per square inch will be equal to 759 n F./sq.in.

Figure 7:
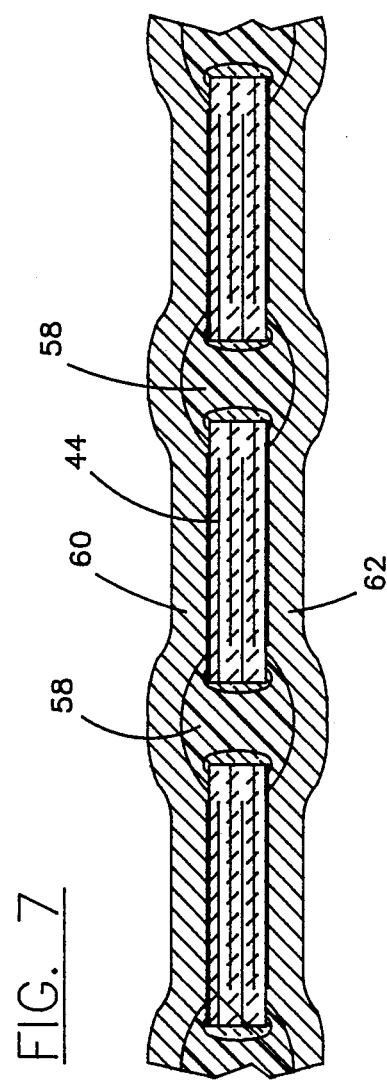
FIG. 7 is a cross-sectional elevation view similar to FIG. 6, subsequent to metallization.
Figure 8:
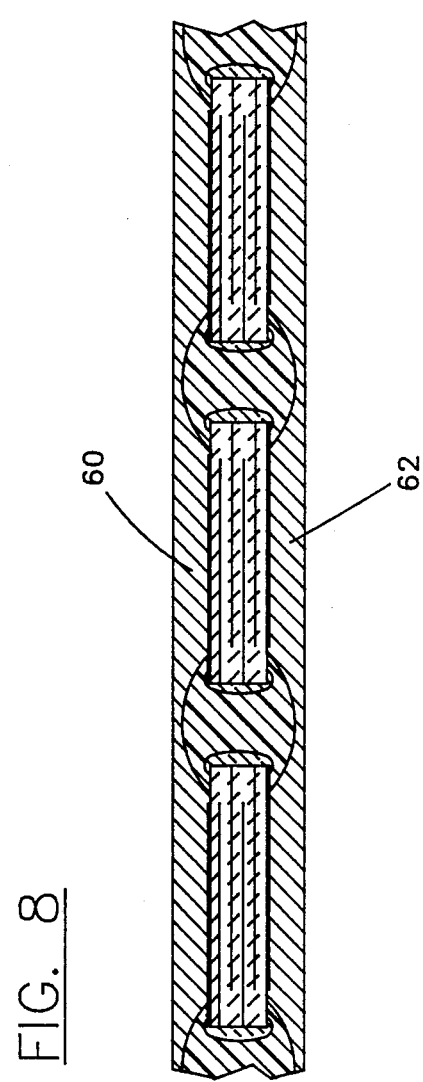
FIG. 8 is a cross-sectional elevation view similar to FIG. 7, and subsequent to additional metallization.

Still another embodiment of the present invention is shown in FIGS. 6–8. In this embodiment, rather than using high dielectric constant pellets of homogeneous composition, a multilayer capacitive element 44 is utilized. Capacitive element 44 is a known multilayer ceramic chip capacitor (such as disclosed in aforementioned U.S. Pat. Nos. 4,745,537 and 4,706,162) comprised of a plurality of metallized layers 46 with alternating layers being connected to end electrodes 48 and 50.

The top and bottom surfaces of multilayer chip 44 includes exposed electrodes 52 and 54 which are also connected to opposed end electrodes 48 and 50, respectively. Finally, an insulating cap 56 is provided on each end electrode 48 and 50 to prevent shorting between an exposed top or bottom electrode 52, 54 and one of the end electrodes 48 and 50. As in the previously discussed embodiments of FIGS. 1–4, in this latter embodiment, a plurality of multilayer capacitative elements 44 are arranged in a monolayer array and a suitable polymeric adhesive 58 is used to bind the side edges of the multilayer chips 44 together. As shown in FIG. 6, this will typically result in an undulating surface between the polymer 58 and each multilayer capacitive element 44. As shown in FIG. 7, the array can then be electroless plated with copper, nickel, tin or any other suitable plating material to define thin metallized outer layers 60 and 62. Of course the undulating surface features may be eliminated by sufficiently building up the thickness of the plated electrodes and then grinding or lapping them to define a planar outer surface as in FIG. 8.

It will be appreciated that the capacitance per unit area for the FIGS. 6–8 embodiment of the present invention will depend upon the size of the chips, the number of the chips per unit area, the capacitance of individual chips and the thickness of the chips.

EXAMPLE 3

As an illustration of the levels of capacitance achievable with the embodiment of FIGS. 6–8, a flexible sheet of the type shown in FIG. 8 using multilayer capacitive elements 44 having length dimensions of 0.35", width dimensions of 0.20" and thickness dimensions of 0.018" will be discussed. The dielectric used in the capacitive element is a lead magnesium niobate dielectric wherein capacitance on an average of 1.0 micro F/chip is obtainable. Next, assuming a 0.030" gap between chips in the chip array, there would be 4.4 chips in the y direction and 3.03 chips in the x direction for a total of 13.33 chips per square inch or a total capacitance of 13.33 micro F./sq.in. This is compared to the far lower capacitance obtained from using the embodiment of FIG. 1 (see Example 1) of 0.312 micro F./sq.in.

Figure 9:
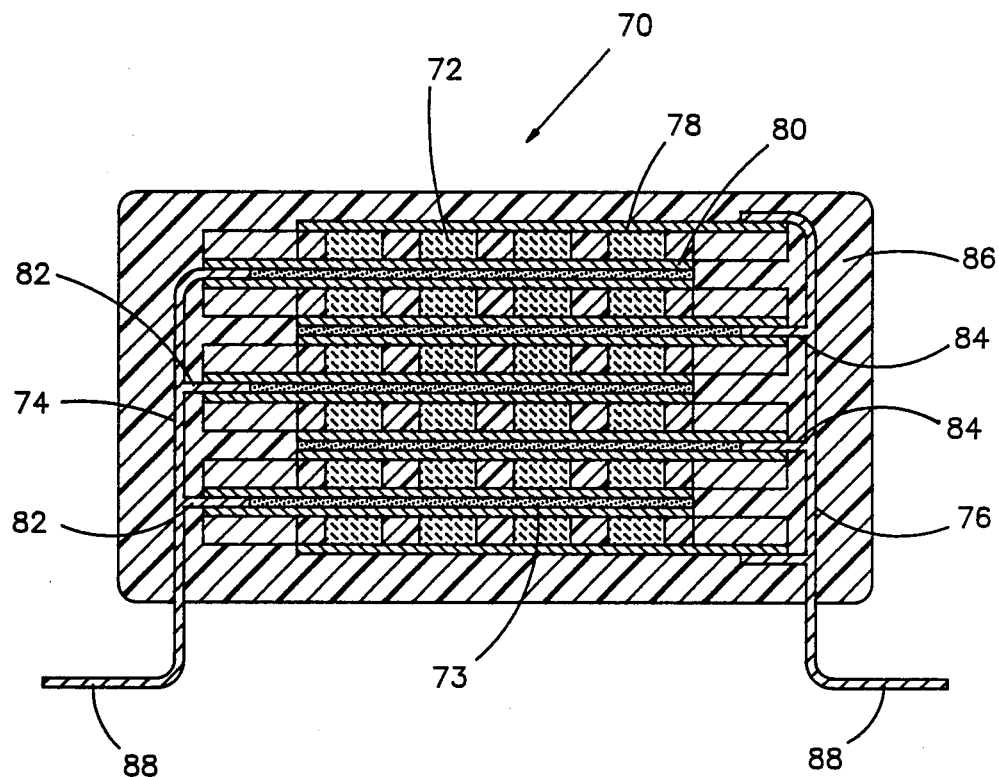
FIG. 9 is a cross-sectional front elevation view of the capacitor of the present invention.
Figure 10:
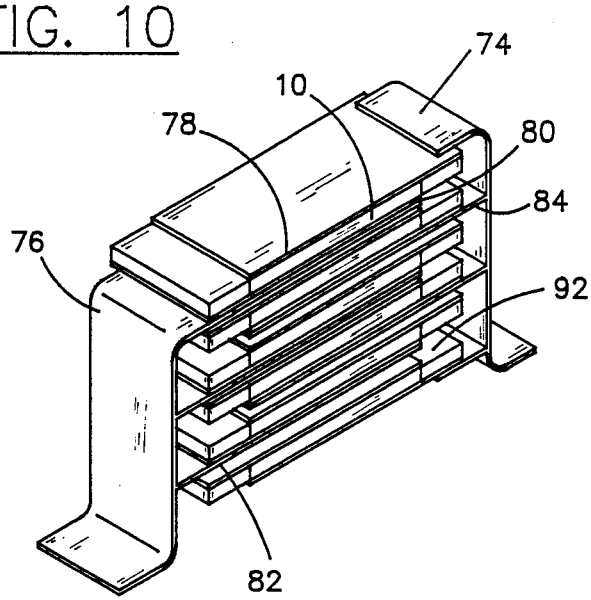
FIG. 10 is a cross-sectional front perspective view of the capacitance of the capacitor of FIG. 8.

Referring now to FIGS. 9–10, a high dielectric capacitor is shown generally at 70. Capacitor 70 is comprised of a plurality of spaced layers 72 of flexible dielectric sheet material of the type described in FIGS. 1–8. Layers 72 are separated by layers 73 of a suitable insulative material. A pair of conductive ribbons 74 and 76 are electrically connected to respective adjacent metallized layers 78 and 80 of each layer 72. Thus, conductive ribbon 74 includes a plurality of substantially perpendicular extensions 82 which electrically connect to alternating metallized layers 78 and 80 while ribbon 76 includes a plurality of extensions 84 for like electrical connection. Once in contact dielectric insulators 72 and conductor ribbons 74 and 76 are encased in an encapsulating material 86. One end of each ribbon 74 and 76 extends beyond the edge of the encapsulating material 86 to form bent tabs 88. Tabs 88 of capacitor 70 allow for electrical contact with other circuitry.

Dielectric layers 72 are comprised primarily of high dielectric flexible sheet material 10 and include opposed polymeric end portions 90.

Each conductive ribbon 74 and 76 contacts dielectric layers at opposing ends. Conductive ribbons 74 and 76 are flattened elongated, relatively wide piece of conductive material. Extensions 82 and 84 are displaced parallel from one another at preselected distances to enable the extensions to contact the dielectric layers at appropriate locations.

Because of the high dielectric flexible layer 10 and wide conductive ribbon 74 and 76, capacitor 70 has both high capacitance and low inductance. A capacitor with these electrical properties is well suited for to noise suppression in high current power distribution systems digital computers, telecommunications modules, AC ripple filtering in DC power supplies, etc.

Figure 11:
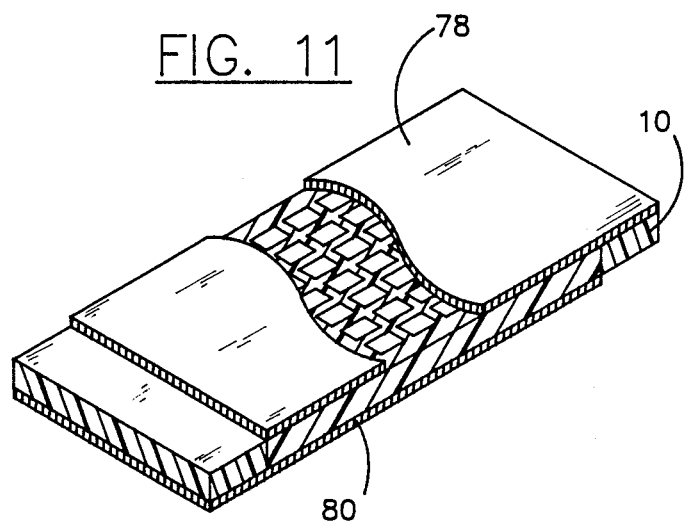
FIG. 11 is a sectional perspective view of the insulator used in the capacitor of FIG. 8.
Figure 12:
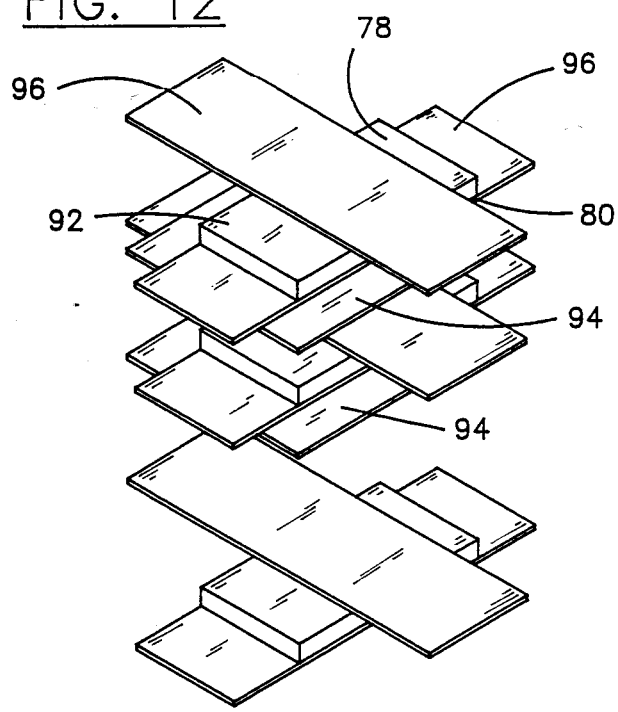
FIG. 12 is an exploded front perspective view of the capacitance elements of an alternative embodiment of the capacitor of FIG. 8.
Figure 13:
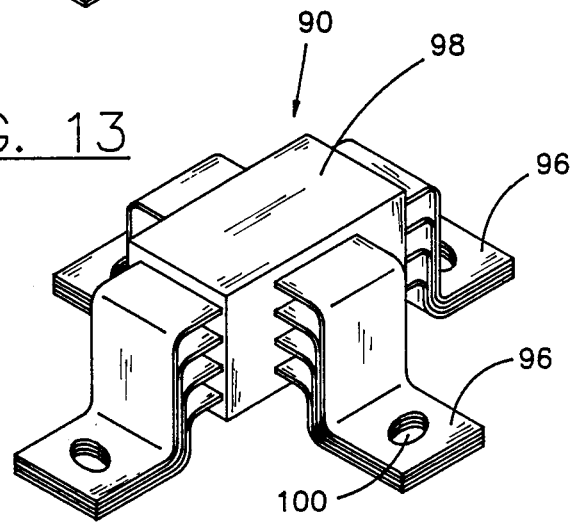
FIG. 13 is a front perspective view which shows the capacitance elements of FIG. 11.

Referring now the FIGS. 12–14, an alternate embodiment of capacitor 70 is shown generally at 90. Capacitor 90 comprises a stack-up of alternating dielectric layers 92, insulating layers 94 (also shown in FIG. 14) and conductive layers 96. Conductive layers 96 are perpendicular to one another and every other layer 96 is separated by a dielectric layer 92, an insulating layer 94, and a perpendicular conductive layer 96. Of course, dielectric layers 92 are of the type disclosed in FIGS. 1–8 and at 72 in FIGS. 9–11. Each conductive layer is perpendicular to an adjacent conductive layer as shown in the FIGURES. As in the FIG. 9 embodiment, in the embodiment of FIG. 13, conductive layers 96 are electrically attached (via solder or conductive adhesive) to the metallized layers on dielectric sheet 92. The stack-up includes as many layers as are needed to reach a predetermined capacitance. When all the layers are aligned as required, an encapsulating material 98 encapsulates the layers.

Insulation layer 94 may be any insulative material, but preferably comprises an insulating adhesive or suitable polymer. Conductive layers 96 are comprised of a flat elongated conductive metal. Each layer 96 is bent together to form a uniform tab 98. Tab 98 has a placement means (e.g. opening 100) for attachment to circuitry The embodiment of FIGS. 12–14 has an advantage over the embodiment of FIGS. 9–11 in that only one main body is required to maintain capacitance for two circuits. However, both of the multi-layer capacitor embodiments of FIGS. 9–14 exhibit excellent electrical and mechanical characteristics including low inductance, low ESR and a compact, sturdy body for ease of installation.

While preferred embodiments have been shown and described, various modifications and substitutions may be made thereto without departing from the spirit and scope of the invention. Accordingly, it is to be understood that the present invention has been described by way of illustrations and not limitation.

What is claimed is:
1. A multi-layer capacitor comprising:
 (1) a plurality of spaced, discrete dielectric sheets, each of said discrete dielectric sheets including;
  (a) an array of spaced high dielectric chips arranged in a single layer, each of said chips having side, top and bottom surfaces;
  (b) a flexible polymeric binder between said side surfaces of said chips and binding said chips to define a cohesive sheet having opposed first and second planar surfaces with said top and bottom surfaces of said chips being exposed on said respective first and second surfaces;
  (c) a first metallized layer o said first planar surface; and
  (d) a second metallized layer on said second planar surface;
 (2) at least a pair of electrically isolated conductive electrodes, each of said electrodes being electrically connected to respective first and second metallized layers on said plurality of discrete dielectric sheets; and
 (3) electrically insulative material between said spaced plurality of discrete dielectric sheets.

2. The capacitor of claim 1 wherein:
said chips comprise a sintered ceramic material.

3. The capacitor of claim 2 wherein:
said ceramic material is selected from the group consisting of barium titanate, lead magnesium niobate or iron tungsten niobate.

4. The capacitor of claim 1 wherein:
said chips have a shape which is selected from the group consisting of cylindrical, rectangular or square.

5. The capacitor of claim 1 including:
at least one groove formed in said chips to enhance mechanical binding with said polymeric binder.

6. The capacitor of claim 1 wherein:
said chips comprise multilayer capacitive elements having exposed top and bottom electrodes which electrically contact respective of said first and second metallized layers.

7. The capacitor of claim 1 wherein:
said first and second metallized layers are comprised of a material selected from the group consisting of copper, nickel or tin.

8. The capacitor of claim 1 wherein:
said polymeric binder is comprised of a flexible thermoplastic or flexibilized thermoset.

9. The capacitor of claim 1 wherein:
said high dielectric chip has a dielectric constant of at least 10,000.

10. The capacitor of claim 1 including:
electrically conductive adhesive means bonding said conductive electrodes to said respective first and second metallized layers on said discrete dielectric sheets.

11. The capacitor of claim 1 including:
electrically conductive solder means bonding said conductive electrodes to said respective first and second metallized layers on said discrete dielectric sheets.

12. The capacitor of claim 1 including:
tab means on said conductive electrodes.

13. The capacitor of claim 12 wherein:
said tab means extend from at least two opposing sides of said capacitor.

14. The capacitor of claim 1 wherein:
each of said conductive electrodes include a plurality of extensions for electrically connecting to said respective first and second metallized layers.

15. The capacitor of claim 14 wherein: said extension extend substantially perpendicular to said conductive electrodes.

16. The capacitor of claim 1 wherein:
each of said electrodes is substantially transverse from an adjacent electrode.

* * * * *